(12) United States Patent
Kimura

(10) Patent No.: US 11,413,793 B2
(45) Date of Patent: Aug. 16, 2022

(54) IMPRINT APPARATUS, IMPRINT METHOD, AND METHOD FOR MANUFACTURING PRODUCT

(71) Applicant: CANON KABUSHIKI KAISHA, Tokyo (JP)

(72) Inventor: Atsushi Kimura, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 366 days.

(21) Appl. No.: 16/414,361

(22) Filed: May 16, 2019

(65) Prior Publication Data
US 2019/0358863 A1 Nov. 28, 2019

(30) Foreign Application Priority Data

May 24, 2018 (JP) .............................. JP2018-100075

(51) Int. Cl.
| | |
|---|---|
| B29C 35/08 | (2006.01) |
| G03F 7/00 | (2006.01) |
| G03F 9/00 | (2006.01) |
| B29C 43/58 | (2006.01) |

(52) U.S. Cl.
CPC .......... *B29C 35/0805* (2013.01); *B29C 43/58* (2013.01); *G03F 7/0002* (2013.01); *G03F 9/7042* (2013.01); *B29C 2035/0827* (2013.01); *B29C 2043/585* (2013.01)

(58) Field of Classification Search
CPC ...... B29C 2035/0827; B29C 2043/585; B29C 35/0805; B29C 43/58; G03F 7/0002; G03F 9/7042; G03F 7/168; G03F 7/70775; G03F 9/7003; H01L 21/027; H01L 21/6715; H01L 21/68
See application file for complete search history.

(56) References Cited

U.S. PATENT DOCUMENTS

2018/0074419 A1    3/2018   Jung

FOREIGN PATENT DOCUMENTS

| JP | 2016-021441 A | 2/2016 |
| JP | 2016-58735 A | 4/2016 |

OTHER PUBLICATIONS

Machine translation JP2016058735. (Year: 2016).*

* cited by examiner

*Primary Examiner* — Robert J Grun

(74) *Attorney, Agent, or Firm* — Canon U.S.A., Inc. IP Division

(57) ABSTRACT

An imprint method for forming a pattern of an imprint material on a substrate includes irradiating the imprint material with light to increase a viscosity of the imprint material on the substrate with a mold and the imprint material being in contact with each other, aligning the substrate and the mold with each other while changing and increasing a control gain to be used in a controller, which is configured to control relative positions of the mold and the substrate so as to reduce a displacement based on a result of detection of the displacement between the substrate and the mold, in such a manner that the control gain increases with the mold and the imprint material being in contact with each other, and curing the imprint material by irradiating the imprint material with light.

10 Claims, 6 Drawing Sheets

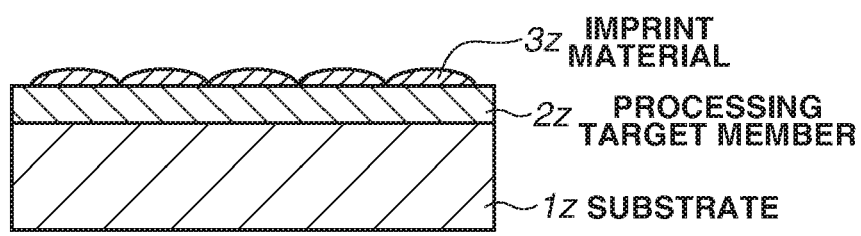
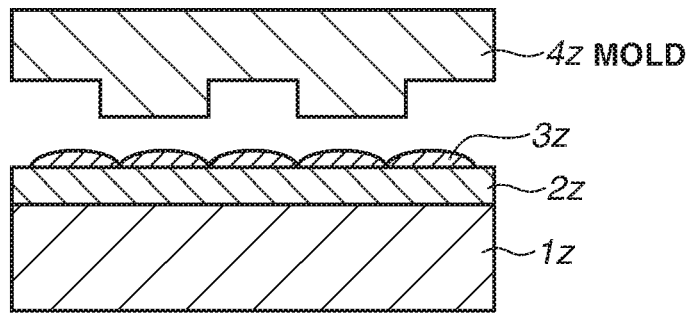
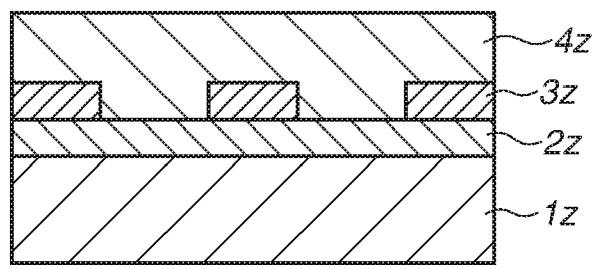
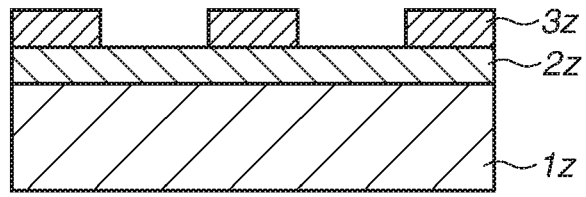
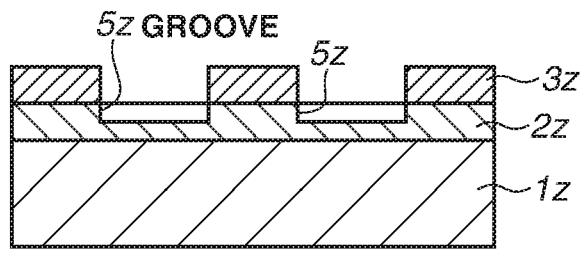
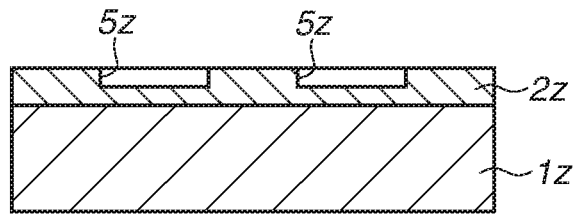

IMPRINT APPARATUS, IMPRINT METHOD, AND METHOD FOR MANUFACTURING PRODUCT

BACKGROUND

Field of the Disclosure

The present disclosure relates to an imprint apparatus, an imprint method, and a method for manufacturing a product.

Description of the Related Art

The demand to microfabricate semiconductor devices, micro electro mechanical systems (MEMSs), and the like has become further acute, and this trend has led to the advancement of development of the imprint technique for molding an imprint material on a substrate with use of a mold to form a pattern of the imprint material on the substrate. The use of the imprint technique allows a fine structure of a size of nanometers to be formed on the substrate.

There is the light curing method as one of imprint methods. In this method, first, uncured light-curable resin (the imprint material) is supplied onto the substrate. Next, this uncured resin and the mold are brought into contact with each other. Then, the resin is cured by irradiation with light with the resin and the mold being in contact with each other. After the imprint material is cured, the mold is separated from the cured imprint material by expanding a spacing between the substrate and the mold, as a result of which the pattern of the imprint material is formed on the substrate.

An imprint apparatus should align a position of a shot region on the substrate and a position of the pattern formed on the mold with each other with the imprint material on the substrate and the mold being in contact with each other. The imprint apparatus detects an alignment mark formed on the mold and an alignment mark formed on the substrate, and positionally adjusts the shot region on the substrate and the pattern on the mold with each other using a detection result so as to align the position of the shot region on the substrate and the position of the pattern on the mold with each other.

Transfer accuracy is further required to improve high-definition micro processing of a size of the nanometers by the imprint technique. Japanese Patent Application Laid-Open No. 2016-58735 discloses, with the aim of preventing a reduction in accuracy of the alignment between the substrate and the mold, irradiating the imprint material with light having a different wavelength or intensity from the light for curing the imprint material to thus increase a viscosity of the imprint material to then damp a vibration, thereby increasing the alignment accuracy.

According to the imprint method discussed in Japanese Patent Application Laid-Open No. 2016-58735, a viscosity degree of the imprint material changes from a low state to a high state during the alignment due to the irradiation with the light. A strong resisting force against driving for alignment is generated in a case of the imprint material having the high viscosity. Regarding a control gain (for example, a proportional gain) used in an alignment device that performs proportional-integral-derivative (PID) control, if this control gain is adapted to the low viscous state, it takes a long time period until completion of the alignment due to the resisting force of the imprint material when the viscosity increases.

SUMMARY

According to an aspect of the present invention, an imprint method is an imprint method for forming a pattern of an imprint material on a substrate by aligning the substrate and a mold with each other and curing the imprint material. The imprint method includes bringing the mold and the imprint material into contact with each other, irradiating the imprint material with light to increase a viscosity of the imprint material on the substrate with the mold and the imprint material being in contact with each other, aligning the substrate and the mold with each other while changing and increasing a control gain to be used in a controller, which is configured to control relative positions of the mold and the substrate so as to reduce a displacement based on a result of detection of the displacement between the substrate and the mold, in such a manner that the control gain increases with the mold and the imprint material being in contact with each other, and curing the imprint material by irradiating the imprint material with light.

Further features of the present invention will become apparent from the following description of exemplary embodiments with reference to the attached drawings.

BRIEF DESCRIPTION OF THE DRAWINGS

FIGS. 6A to 6F illustrate a method for manufacturing a product.

DESCRIPTION OF THE EMBODIMENTS

Figure 1:
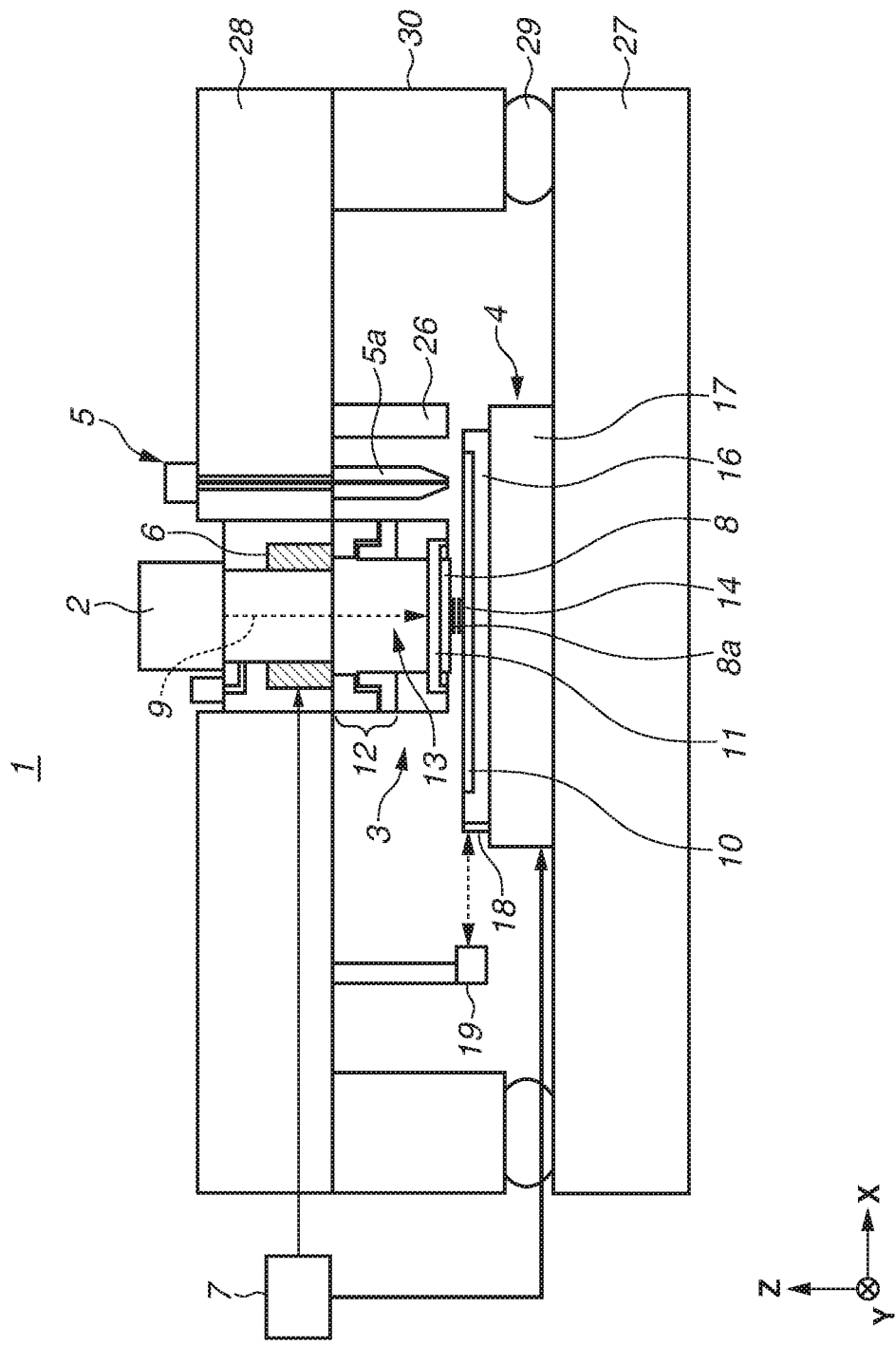
FIG. 1 illustrates a configuration of an imprint apparatus according to a first exemplary embodiment.

In the following description, a representative exemplary embodiment of the present invention will be described in detail with reference to the accompanying drawings. The same members will be identified by the same reference numerals in each of the drawings, and a redundant description will be omitted.

An imprint apparatus 1 according to a first exemplary embodiment will be described with reference to FIG. 1. FIG. 1 illustrates a configuration of the imprint apparatus 1 according to the first exemplary embodiment. The imprint apparatus 1 is an apparatus that molds an uncured imprint material 14 on a substrate 10 as a processing target object with use of a mold 8 to form a pattern of the imprint material 14 on the substrate 10. The imprint apparatus 1 according to the present exemplary embodiment is an apparatus that employs the light-curing method, according to which an imprint material (ultraviolet-curable resin) is cured by irradiation with light (an ultraviolet ray). In the drawing that will be described below, a Z axis is defined to represent a direction in parallel with an optical axis of an illumination system that irradiates the imprint material 14 on the substrate 10 with a ultraviolet ray 9, and an X axis and a Y axis are set so as to extend perpendicularly to each other in a plane perpendicular to the Z axis (in a surface of the substrate 10).

In this manner, the imprint apparatus 1 is an apparatus that forms a pattern of a cured object with a concave-convex pattern of the mold 8 transferred thereon by bringing the imprint material 14 supplied on the substrate 10 into contact with the mold 8 and applying curing energy to the imprint material 14.

The imprint apparatus 1 includes a light irradiation unit 2, a mold holding mechanism 3 (a mold holding unit), a substrate stage 4, an application unit 5, a preliminary exposure unit 6 (a preliminary curing unit), and a control unit 7.

The light irradiation unit 2 irradiates the imprint material 14 with the ultraviolet ray 9 at the time of curing the imprint material 14 on the substrate 10 in imprint processing. In the present example, the ultraviolet ray 9 from the light irradiation unit 2 irradiates the imprint material 14 therewith via the mold 8 (by being transmitted through the mold 8). The light irradiation unit 2 includes a not-illustrated light source, and an optical element (a lens, a mirror, a light shield plate, and the like) that adjusts the ultraviolet ray 9 emitted from the light source to be in a ray state appropriate for the imprinting (a light intensity distribution, an illumination region, and the like).

The mold holding mechanism 3 includes a mold chuck 11, which holds the mold 8, and a mold driving mechanism 12, which holds the mold chuck 11 and moves the mold 8 (the mold chuck 11). The mold chuck 11 can hold the mold 8 by attracting the mold 8 with use of a vacuum attraction force or an electrostatic force. For example, in the case where the mold chuck 11 holds the mold 8 with use of the vacuum attraction force, the mold chuck 11 is connected to a not-illustrated vacuum pump, and attachment and detachment of the mold 8 are switched by turning on and off this vacuum pump.

The mold 8 is a mold for molding an imprint material on a substrate. The mold (an imprint mold) can also be called a template or an imprint template. The mold 8 has a rectangular outer shape, and includes a pattern portion 8a (a pattern region) on a pattern surface (a first surface) where the pattern (the concave-convex pattern) that is to be transferred onto the substrate 10 (the imprint material 14 thereon) is formed. The mold 8 is made from a material that transmits the ultraviolet ray 9 for curing the imprint material 14 on the substrate 10, such as quartz. Further, a mold-side mark functioning as an alignment mark is formed on the pattern portion 8a of the mold 8. Further, the mold 8 may be shaped in such a manner that a cavity (a recessed portion) having a circular planar shape and a certain depth is formed on a surface to be irradiated with the ultraviolet ray 9 to facilitate deformation.

Further, the mold chuck 11 and the mold driving mechanism 12 include an opening region 13 on a central portion (an inner side) in such a manner that the ultraviolet ray 9 emitted from the light irradiation unit 2 is directed toward the substrate 10. A light transmissive member (for example, a glass plate) is installed in this opening region 13 so as to sealingly close a space surrounded by a part of the opening region 13 and the mold 8 to form a sealed space, and a pressure in the sealed space is adjusted by a not-illustrated pressure adjustment device including a vacuum pump or the like. The pressure adjustment device bends the mold 8 to have a convex shape toward the substrate 10 by setting the pressure in the sealed space to a higher pressure than outside thereof when, for example, the pattern portion 8a of the mold 8 and the imprint material 14 on the substrate 10 are brought into contact with each other. Bending the mold 8 into the convex shape brings the mold 8 into contact with the imprint material 14 on the substrate 10 from a central portion of the pattern portion 8a. As a result, the imprint apparatus 1 can eliminate or reduce gas (air) remaining between the pattern portion 8a and the imprint material 14, thereby thoroughly filling concave-convex portions of the pattern portion 8a with the imprint material 14.

The mold driving mechanism 12 moves the mold 8 in the Z-axis direction so as to allow the mold 8 and the imprint material 14 on the substrate 10 to contact each other or to separate from each other. Examples of an actuator usable for this mold driving mechanism 12 include a linear motor and an air cylinder. Further, the mold driving mechanism 12 may include a plurality of driving systems such as a coarse motion driving system and a fine motion driving system to enable highly accurate positioning of the mold 8. Further, the mold driving mechanism 12 may include driving systems having a function of adjusting the position not only in the Z-axis direction but also in the X-axis direction and the Y-axis direction or in a $\theta$ (a rotation around the Z axis) direction, a tilt function for correcting a tilt of the mold 8, and the like function.

The contact and separation operations in the imprint apparatus 1 may be realized by moving the mold 8 in the Z-axis direction, but may be realized by moving the substrate stage 4 in the Z-axis direction or may be realized by moving both of them relative to each other.

The substrate stage 4 (a substrate holding unit) holds the substrate 10, and aligns the mold 8 and the substrate 10 with each other by movement in a planar direction along the surface of the substrate 10 when the mold 8 and the imprint material 14 on the substrate 10 are brought into contact with each other. The substrate stage 4 includes a substrate chuck 16, which holds the substrate 10 with use of an attraction force, and a substrate driving mechanism 17, which holds this substrate chuck 16 by a mechanical method and makes the substrate chuck 16 movable in each axis direction. Examples of an actuator usable for this substrate driving mechanism 17 include a linear motor and a planar motor. The substrate driving mechanism 17 may also include a plurality of driving systems such as a coarse motion driving system and a fine motion driving system with respect to the respective directions of the X axis and the Y axis. Further, the substrate driving mechanism 17 may also be configured to include a driving system for adjusting the position in the Z-axis direction, a function for adjusting the position of the substrate 10 in the $\theta$ direction, a tilt function for correcting a tilt of the substrate 10, and the like function.

Further, the substrate stage 4 includes, on a side surface thereof, a plurality of reference mirrors 18 (a refection unit) corresponding to the respective directions of X, Y, and Z. Further, the substrate stage 4 may include a plurality of reference mirrors 18 corresponding to $\omega x$, $\omega y$, and $\omega z$ indicating rotational directions corresponding to the respective directions of X, Y, and Z.

The imprint apparatus 1 may include a laser interferometer 19 (a substrate position measurement unit) to measure the position of the substrate stage 4. The imprint apparatus 1 may include a plurality of laser interferometers 19 respectively corresponding to the above-described reference mirrors 18. The laser interferometer 19 measures the position of the substrate stage 4 by irradiating each of the reference mirrors 18 with a beam. The laser interferometer 19 measures the position of the substrate stage 4 in real time, and the control unit 7, which will be described below, controls positioning of the substrate 10 (the substrate stage 4) based on a measured value obtained at this time. Further, the imprint apparatus 1 may include a laser interferometer (a mold position measurement unit) to measure the position of the mold holding mechanism 3. The positions of the mold holding mechanism 3 and the substrate stage 4 do not necessarily have to be measured with use of the laser interferometers, and may be measured with use of a length measurement device, such as a linear scale and a linear encoder.

The substrate 10 is made of glass, ceramic, metal, a semiconductor, resin, or the like, and may include a member made of a different material from the substrate 10 formed on the surface thereof as needed. Examples thereof include a single-crystal silicon substrate and a silicon-on-insulator (SOI) substrate, and ultraviolet-curable resin is applied as the imprint material 14 onto a processing target surface where the pattern will be formed on the substrate. Specific examples of the substrate 10 include a silicon wafer, a compound semiconductor wafer, and a quartz glass.

The application unit 5 (a dispenser) is placed in the imprint apparatus 1, and supplies (applies) the uncured imprint material 14 onto the processing target surface of the substrate 10. The imprint material 14 is light-curable resin having a property curable by irradiation with light, and is appropriately selected considering various conditions such as a process for manufacturing a semiconductor device. Further, the application unit 5 includes a discharge nozzle 5a (a discharge port), from which the uncured imprint material 14 is discharged. An amount and an application position of the imprint material 14 discharged from the discharge nozzle 5a are appropriately determined according to a thickness of the imprint material 14 to be formed on the substrate 10, a density of the pattern to be formed on the substrate 10, and the like.

A curable composition (which may also be referred to as resin in an uncured state) to be cured by the curing energy is used as the imprint material 14. An electromagnetic wave, heat, or the like is used as the curing energy. Examples usable as the electromagnetic wave include light having a wavelength selected from a range of 10 nm or longer and 1 mm or shorter, such as an infrared ray, a visible ray, and an ultraviolet ray.

The curable composition is a composition cured by the irradiation with light or by heating. The light-curable composition cured by the irradiation with light contains at least a polymerizable compound and a photopolymerization initiator, and may contain a non-polymerizable compound or a solvent as needed. The non-polymerizable compound is at least one kind of substance selected from a group such as a sensitizer, a hydrogen donator, an internal mold release agent, a surface-active agent, an anti-oxidant, and a polymer component.

The imprint material 14 may be applied in the form of a film onto the substrate 10 with use of a spin coater or a slit coater. Alternatively, the imprint material 14 may be applied onto the substrate 10 in the form of a droplet or in the form of an island or a film formed from a plurality of droplets combined with one another, with use of a liquid injection head. A viscosity of the imprint material 14 (a viscosity at 25 degrees Celsius) is, for example, 1 mPa·s or higher and 100 mPa·s or lower.

The preliminary exposure unit 6 irradiates the imprint material 14 with irradiation light having a wavelength sensitive to the uncured imprint material 14 supplied onto the substrate 10 (light having a wavelength that cures the resin). The imprint material 14 increases in viscosity by the irradiation with the irradiation light from the preliminary exposure unit 6.

The imprint material 14 supplied onto the substrate 10 has a low viscosity, and therefore the imprint material 14 easily fills the pattern portion 8a of the mold 8. Therefore, bubbles remaining on the pattern portion 8a can be reduced. However, the low viscosity of the imprint material 14 may cause a displacement between the mold 8 and the substrate 10 due to an outer disturbance. If the imprint material 14 is cured with the mold 8 and the substrate 10 misaligned with each other, accuracy of the alignment decreases.

To address the inconvenience, there is known a technique that reduces occurrence of the displacement by irradiating the imprint material 14 with the light from the preliminary exposure unit 6 to increase the viscosity of the imprint material 14 after bringing the pattern portion 8a of the mold 8 and the imprint material 14 into contact with each other.

The light source of the light irradiation unit 2, which emits the light (the ultraviolet ray 9) for curing the uncured imprint material 14, can also be used as a light source for the preliminary exposure unit 6. The preliminary exposure (preliminary curing) by the preliminary exposure unit 6 is carried out by the time the imprint material 14 is cured by the ultraviolet ray 9 after the imprint material 14 is supplied onto the substrate 10 and the mold 8 and the imprint material 14 are brought into contact with each other. In other words, the preliminary exposure is carried out at the time of the alignment between the mold 8 and the substrate 10. The alignment between the mold 8 and the substrate 10 is carried out by detecting an alignment mark corresponding to the pattern portion 8a formed on the mold 8 and an alignment mark corresponding to a shot region disposed on the substrate 10. In other words, the alignment between the mold 8 and the substrate 10 means alignment between the pattern portion 8a and the shot region. The alignment between the mold 8 and the substrate 10 may include a process for changing the shape of the mold 8 (the pattern portion 8a).

If the light emitted from the light irradiation unit 2 (the ultraviolet ray 9) is employed as the light for use in the preliminary exposure as it is, the imprint material 14 may be cured before the alignment between the mold 8 and the substrate 10 is completed.

Accordingly, the preliminary exposure unit 6 gives the imprint material 14 an appropriate viscosity that prevents the imprint material 14 from being cured, by, for example, attenuating a light amount of the light emitted from the light irradiation unit 2 by a predetermined amount or removing some wavelength thereof. More specifically, methods therefore include an optical filter (an optical element) that reflects or absorbs and blocks (separates) light having the certain wavelength, a shutter that limits a transmitted amount of the light by reducing an aperture amount, such as a pinhole, and the like. In this manner, the preliminary exposure may irradiate the imprint material 4 with lower intensity light than when the imprint material 4 is cured over the entire shot region, with use of the filter as the preliminary exposure unit 6. Alternatively, the preliminary exposure may irradiate the imprint material 14 with the light for a shorter irradiation time period than when the imprint material 14 is cured over the entire shot region, with use of the shutter as the preliminary exposure unit 6. Thus, an exposure amount for increasing the viscosity of the imprint material 14 is smaller than an exposure amount for curing the imprint material 14. Further, a digital mirror device illustrated in FIGS. 5A to 5F may be used as the preliminary exposure unit 6. The digital mirror device (a digital micro-mirror device) will be referred to as a "DMD" herein. FIGS. 5A to 5F illustrate a DMD 65 that can be used as the preliminary exposure unit 6 in the present exemplary embodiment. This DMD 65 includes a plurality of mirror elements 80 disposed in an optical path of the light emitted from the light irradiation unit 2, and can change an irradiation amount and an irradiation position of the light of the preliminary exposure by individually changing a slope angle and/or an azimuth angle of a reflection surface of each of the mirror elements 80. Thus, the DMD 65 is an adjustment means that adjusts the irradiation amount and the irradiation position of the illumination light of the preliminary exposure. For example, an irradiation area can be changed by, for example, irradiating a partial region in the shot region at the time of the preliminary exposure and irradiating the entire shot region when curing the imprint material 14.

Figure 5A:
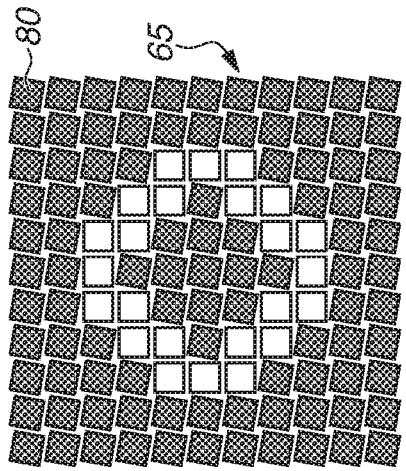
FIGS. 5A to 5F illustrate a preliminary exposure unit according to the first exemplary embodiment.

FIGS. 5A to 5F are schematic views illustrating a configuration of an outer appearance of a reflection surface of the DMD 65. This DMD 65 includes the plurality of mirror elements 80 arrayed in the form of a grid as illustrated in FIG. 5A. The DMD 65 is provided in the preliminary exposure unit 6, and irradiates the imprint material 14 by reflecting the light from the light irradiation unit 2 with use of the mirror elements 80. The slope angle and/or the azimuth angle of the reflection surface of each of these mirror elements 80 can be changed based on an operation instruction from the control unit 7. In other words, the DMD 65 can change a reflection direction of the light, and forms an arbitrary distribution of the irradiation amount to be emitted toward the pattern portion 8a. The plurality of mirror elements 80 is adjusted to change the reflection direction of the mirror elements 80 of the DMD 65 as illustrated in FIGS. 5B to 5F according to a region where the mold 8 and the imprint material 14 are in contact with each other. Carrying out such a preliminary exposure can increase the viscosity of the imprint material 14 for each location where the mold 8 and the imprint material 14 are in contact with each other.

Figure 5B:
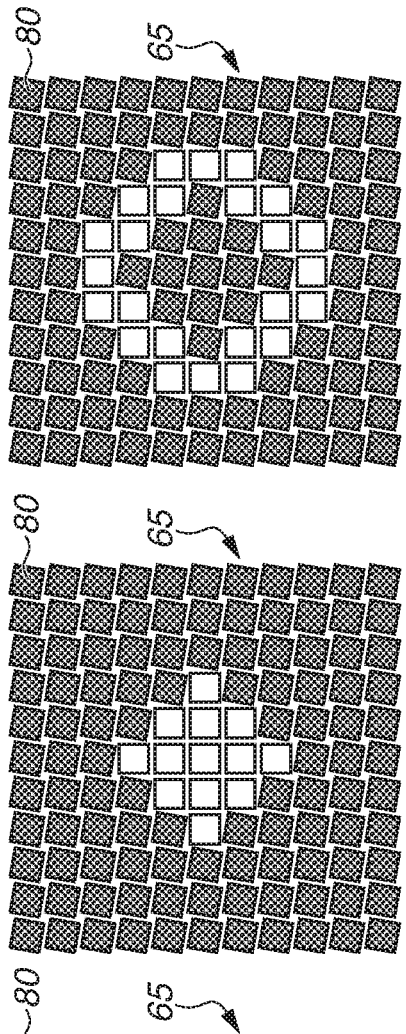
Figure 5C:
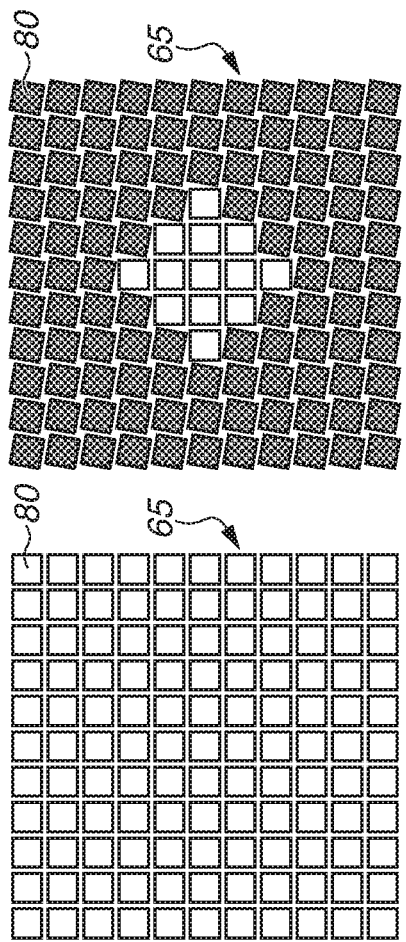
Figure 5D:
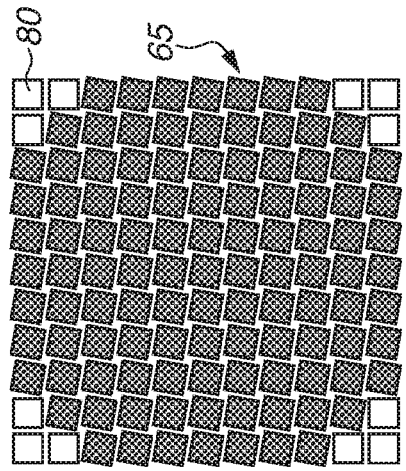
Figure 5E:
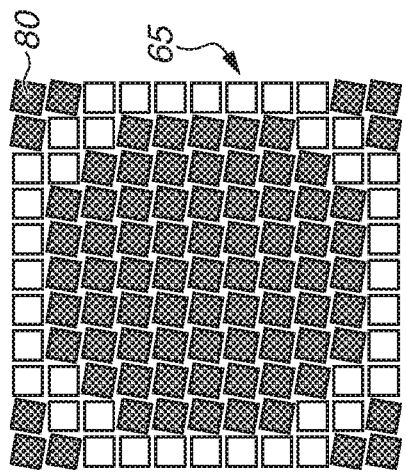
Figure 5F:
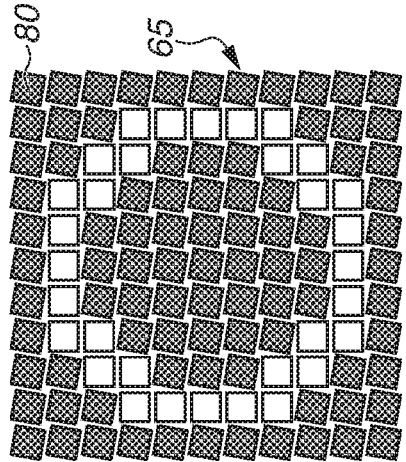

Further, the preliminary exposure not only may irradiate the entire surface of the shot region with the light but also may irradiate only a part of the shot region. For example, in the preliminary exposure, only a part of the shot region may be irradiated as illustrated in FIG. 5B. Further, in the preliminary exposure, a periphery (a peripheral region) of the shot region may be irradiated with the irradiation light as illustrated in FIG. 5E. Irradiating the periphery around the shot region as the peripheral region with the light can reduce the imprint material 14 spreading out of the pattern portion 8a of the mold 8 after contacting the mold 8. In the preliminary exposure, the periphery around the shot region may be irradiated with the light in any manner as long as it irradiates at least a part of the periphery around the shot region. For example, the preliminary exposure can be partially carried out by selecting a region less influential on the formation of the pattern, such as a region used for a scribe line and a region where the alignment mark is formed, as the part of the shot region.

The imprint apparatus 1 includes an alignment detection system 26 for measuring a shape (a size) or a layout of the shot region of the substrate 10. Desirably, this alignment detection system 26 (an alignment detection unit) is configured to keep detection accuracy intact even if the light of the preliminary exposure or the light for curing the imprint material 14 is incident thereon. For this purpose, the alignment detection system 26 may be configured to prevent or reduce entry of the reflected light or diffracted light of the exposure light into the alignment detection system 26. Alternatively, the optical system may be configured to keep the detection accuracy intact even if the reflected light or diffracted light of the light of the preliminary exposure or the light for curing the imprint material 14 is incident on the alignment detection system 26. For example, the alignment detection system 26 may be configured in such a manner that light having a wavelength different from the light of the preliminary exposure and the light for curing the imprint material 14 is used as a light source of the alignment detection system 26, and an optical filter (an optical element) that blocks the light of the preliminary exposure and the light for curing the imprint material 14 is built in the alignment detection system 26.

By configuring the alignment detection system 26 in this manner, the alignment detection system 26 can detect the alignment mark formed on each of the shot region of the substrate 10 and the pattern portion 8a without reducing the detection accuracy of the alignment detection system 26 even during the preliminary exposure or the irradiation with the light for curing the imprint material 14. The imprint apparatus 1 can determine the displacement between the mold 8 and the substrate 10 based on a result of the detection of the alignment marks, and achieve the alignment between them.

The control unit 7 can control, for example, an operation and an adjustment of each of the components of the imprint apparatus 1. The control unit 7 includes, for example, a computer. The control unit 7 is connected to each of the components of the imprint apparatus 1 via a line, and can control each of the components according to a program or the like. The control unit 7 according to the present exemplary embodiment performs control of the operation of the preliminary exposure unit 6, and alignment control by calculating at least a correction amount based on information from the alignment detection system 26 and displacing the substrate stage 4 or the like to make the correction. The control unit 7 may be provided in the imprint apparatus 1 or may be placed at a different site from the imprint apparatus 1 to remotely control the imprint apparatus 1.

Further, the imprint apparatus 1 includes a base platen 27, on which the substrate stage 4 is placed, a bridge platen 28, on which the mold holding mechanism 3 is fixed, and a support rod 30, which extends from the base platen 27 and supports the bridge platen 28 via a vibration isolator 29. The vibration isolator 29 removes a vibration that would be transmitted from a floor surface to the bridge platen 28. Further, the imprint apparatus 1 can include a mold conveyance mechanism (not illustrated) that conveys the mold 8 from outside the apparatus 1 to the mold holding mechanism 3, a substrate conveyance mechanism (not illustrated) that conveys the substrate 10 from outside the apparatus 1 to the substrate stage 4, and the like.

(Regarding Imprint Method)

Figure 2:
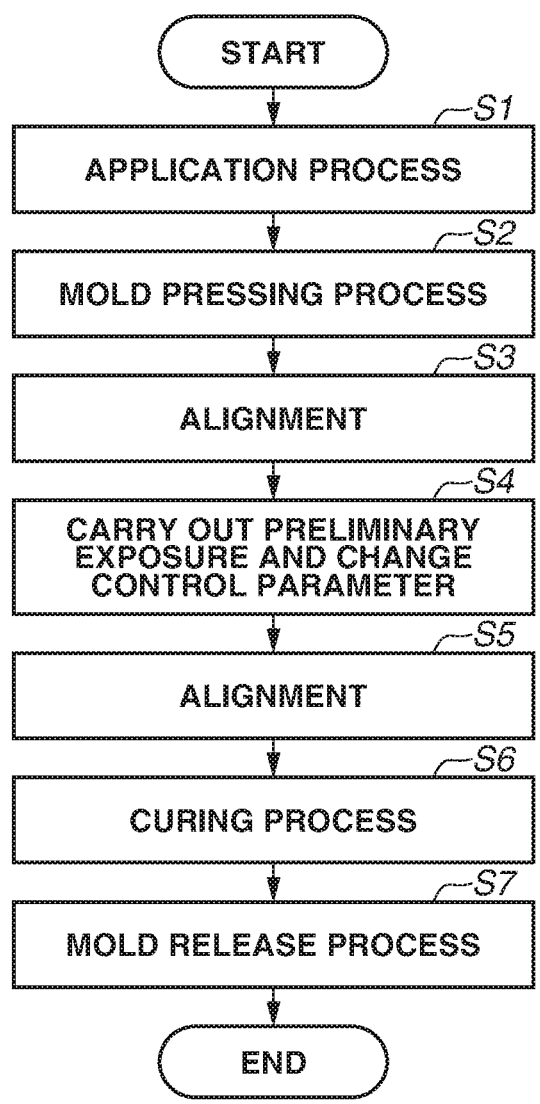
FIG. 2 illustrates a flow of an imprint method according to the first exemplary embodiment.

FIG. 2 illustrates a flow of an imprint method according to the present exemplary embodiment. Upon a start of the imprint processing, in step S1, the imprint apparatus 1 applies the imprint material 14 onto the substrate 10 at a desired layout position with use of the application unit 5 (an application process). In step S2, the imprint apparatus 1 places the substrate 10 with the imprint material 14 applied thereon at a position facing the mold 8, and brings the pattern portion 8a of the mold 8 into contact with the imprint material 14 with use of the mold driving mechanism 12 (a mold pressing process). After the mold pressing process, in step S3, the imprint apparatus 1 aligns the mold 8 and the substrate 10 based on the result of detecting the mark on the mold 8 and the mark on the substrate 10 with use of the alignment detection system 26 before the preliminary exposure. The alignment in step S3 is defined to be an alignment process before an irradiation process. During this process, the imprint material 14 spreads on and fills the entire surface and the recessed portions of the pattern portion 8a of the mold 8. The filling of the imprint material 14 can be regarded as completed, for example, when the bubbles remaining in the recessed portions of the pattern portion 8a are eliminated after the pattern portion 8a and the imprint material 14 contact each other.

In this manner, after filling the pattern portion 8a with the imprint material 14 while aligning the mold 8 and the substrate 10 with each other, in step S4, the imprint apparatus 1 carries out the preliminary exposure with use of the preliminary exposure unit 6. The preliminary exposure operation with use of the preliminary exposure unit 6 in step S4 may impair a capability of the imprint material 14 to fill the micropattern of the pattern portion 8a since the operation leads to an increase in the viscosity of the imprint material 14. Therefore, it is desirable to carry out the preliminary exposure after filling the pattern portion 8a instead of carrying out the preliminary exposure immediately after the mold pressing process.

In this step 4, a parameter for driving control in the alignment is changed at the same time as the start of the preliminary exposure. The parameter of the driving control is changed according to the change in the viscosity of the imprint material 14 due to the preliminary exposure. Alternatively, the parameter does not have to be changed at the same time as the start of the preliminary exposure because the intended effect can be obtained as long as the parameter of the driving control is changed at least between before and after the preliminary exposure. For example, the parameter may be changed immediately before the preliminary exposure is started, or the control parameter (a control gain) may be changed after the irradiation with the light by the preliminary exposure is ended (after the end of the preliminary exposure).

In step S5, the imprint apparatus 1 positionally adjusts (aligns) the mold 8 and the substrate 10 based on the result of detecting the mark on the mold 8 and the mark on the substrate 10 with use of the alignment detection system 26 also after the preliminary exposure. In step S5, the imprint apparatus 1 aligns the positions with the imprint material 14 having the increased viscosity due to the preliminary exposure.

After carrying out the alignment to cause a displacement amount to converge on a neighborhood of zero after the preliminary exposure, in step S6, the imprint apparatus 1 cures the imprint material 14 by irradiating the imprint material 14 with the ultraviolet ray 9 (a curing process). After the curing process is performed in step S6, the imprint material 14 is cured, which makes it difficult to align the mold 8 and the substrate 10 by moving them relative to each other.

In step S7, the imprint apparatus 1 separates the mold 8 from the cured imprint material 14 (a mold release process). The imprint apparatus 1 can form the pattern of the imprint material 14 on the substrate 10 by separating the mold 8 from the cured imprint material 14, with which a series of imprint processes is ended. The pattern of the imprint material 14 can be formed on the substrate 10 by repeating the series of processes in the imprint processing illustrated in FIG. 2 for each of shot regions disposed on the substrate 10.

Figure 3:
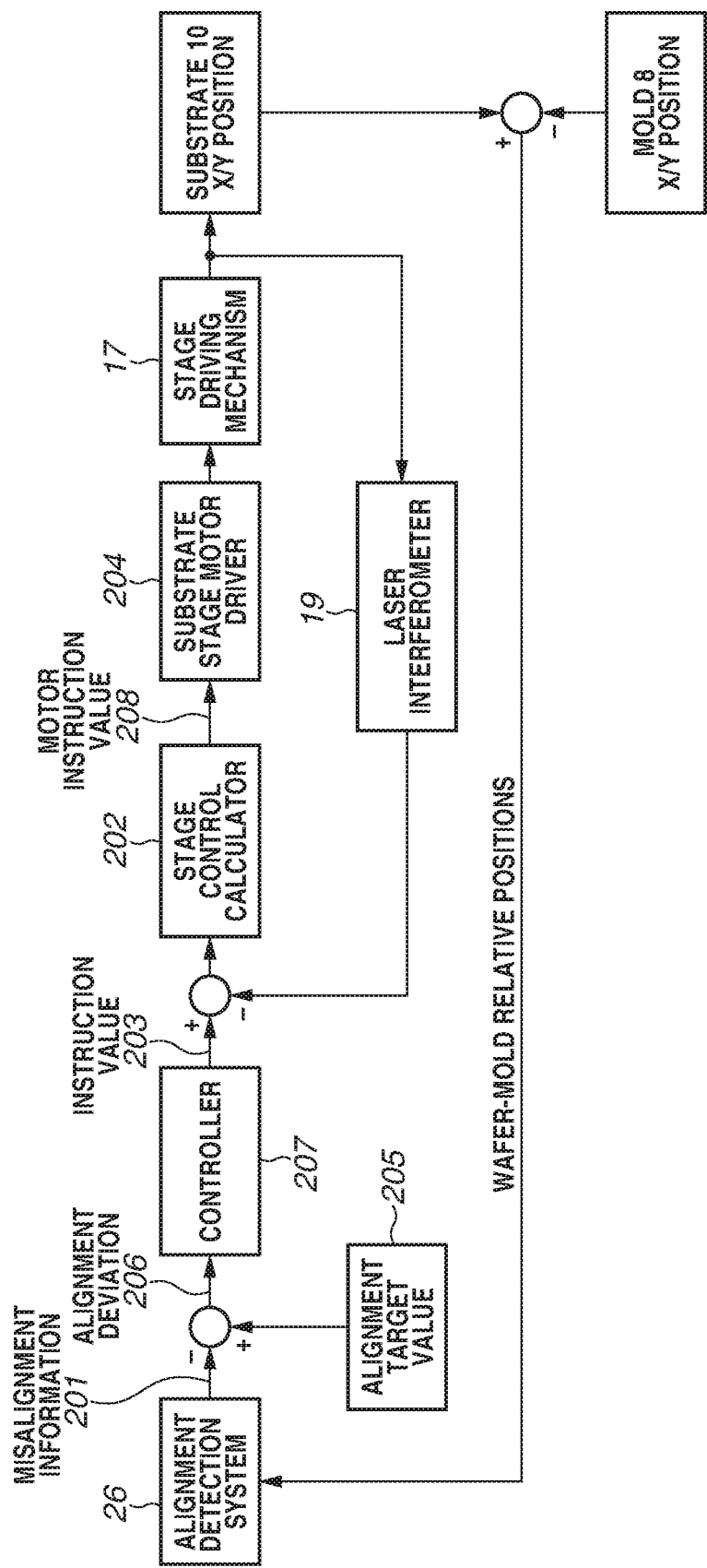
FIG. 3 is a block diagram of calculators in a control unit according to the first exemplary embodiment.

FIG. 3 illustrates one example of the control unit 7 for correcting the displacement by driving the substrate stage 4 based on the displacement between the mold 8 and the substrate 10 that is detected by the alignment detection system 26. Displacement information 201 output from the alignment detection system 26 is used to calculate an alignment deviation 206 based on a difference thereof from an alignment target value 205, and the alignment deviation 206 is input to a controller 207. The controller 207 generates an instruction value 203 directed to the substrate stage 4. A positional control calculator for the substrate stage 4 calculates a difference between the position of the substrate stage 4 measured by the laser interferometer 19 and the positional instruction value 203, and this difference is input to a stage control calculator 202, which controls the substrate stage 4. The stage control calculator 202 generates a motor instruction value 208 directed to a driver 204 for driving the substrate driving mechanism 17. The controller 207 includes a PID control system constructed by combining a comparator, an integrator, and a differentiator, a filter that damps a vibration component in a certain frequency domain, and the like. Further, the controller 207 is formed of, for example, a non-linear control calculator having a non-linear relationship between an input and a calculation result thereof. Any of the calculators receives the displacement information 201 as an input and changes the value of the instruction value 203 according to the degree of the displacement information 201. A ratio thereof is determined according to constants of the individual control calculators, and these constants can be changed any time.

Figure 4:
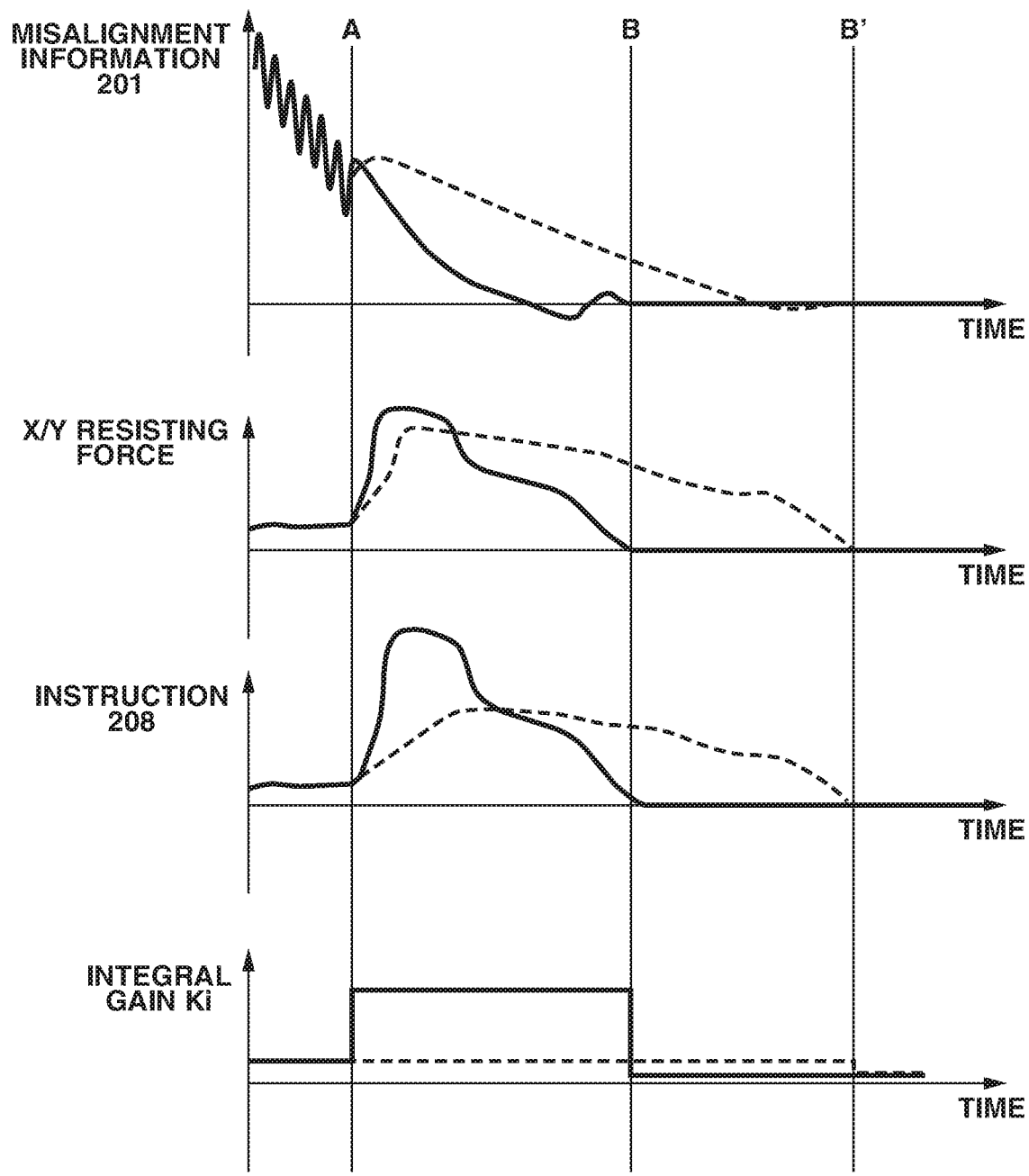
FIG. 4 illustrates a displacement, an instruction value, and a gain of an integrator according to the first exemplary embodiment.

FIG. 4 illustrates a value measured by the alignment detection system 26 at the time of the positional adjustment (the alignment), and a resisting force in the X/Y direction that is generated between the substrate 10 and the mold 8 due to the driving of the substrate stage 4 for the alignment. Further, FIG. 4 illustrates the instruction value 208, which is the output of the stage control calculator 202 that is used so as to perform the positioning against the viscosity of the imprint material 14 generated between the substrate 10 and the mold 8. Further, FIG. 4 illustrates a gain Ki of the integrator as an example of the constant of the stage control calculator 202 for the substrate stage 4.

In each of graphs illustrated in FIG. 4, a horizontal axis represents time. The imprint apparatus 1 carries out the preliminary exposure with use of the preliminary exposure unit 6 at a time indicated as time A.

Before time A illustrated in FIG. 4, the imprint material 14 has a low viscosity and the resisting force in the X/Y direction is small. Therefore, the displacement converges early. On the other hand, the substrate stage 4 and/or the mold 8 may be undesirably displaced just like vibrating in the X/Y direction under the influence of the external disturbance. The preliminary exposure is not carried out yet at this time, and therefore the effect of damping the vibration owing to the viscosity is also low, so that the alignment detection system 26 largely fluctuates. The disturbance may be caused, for example, by a vibration transmitted to the substrate stage 4 or the like that is derived from a floor vibration which is not completely removed by the vibration isolator 29, or a drive reaction force when the substrate stage 4 is driven to reciprocate at a high speed below the application unit 5 and the mold 8 to apply the imprint material 14 onto the substrate 10.

If the imprint material 14 is cured by the irradiation with the ultraviolet ray 9 when the value measured by the alignment detection system 26 (the displacement information 201) is considerably vibrating under the influence of the disturbance, an amplitude due to the disturbance becomes fixed with the substrate 10 and the mold 8 being misaligned with each other. Therefore, at time A, the preliminary exposure is carried out to half-cure the imprint material 14 to increase the viscosity. The increase in the viscosity of the imprint material 14 leads to a reduction in the amplitude of the vibration due to the influence of the disturbance or the like.

On the other hand, the resisting force caused by the alignment drive increases after the preliminary exposure is carried out at time A. If the gain Ki of the stage control calculator 202 for the substrate stage 4 excessively increases with the low resisting force before the preliminary exposure is carried out at time A, an overshoot amount may excessively increase with respect to the target value for correcting the displacement. Further, the excessively large gain Ki may cause the calculation result by the calculator to diverge, which leads to oscillation of the substrate stage 4, thereby resulting in an increase in the fluctuation in the displacement amount.

However, in a state where the resisting force becomes high after the preliminary exposure is carried out at time A, if a similar constant (the gain Ki) to the constant before time A when the resisting force is low, is used, the output of the integrator increases at a slower speed. Consequently, the increase in the instruction value 203 does not keep up with the sudden great fluctuation of the resisting force which is to be countered, and it takes a long time for the detected displacement to converge as indicated by a dotted line in FIG. 4. It is desirable to carry out a main exposure that cures the imprint material 14 after the displacement amount converges on the neighborhood of zero (an allowable value or smaller). Therefore, when it takes time to converge to handle the displacement, a time period for the alignment is necessary up to that indicated as time B' illustrated in FIG. 4. A change of the control gain of the control device that carries out the alignment, may be made during the above-described irradiation with the light for increasing the viscosity of the imprint material 14 (the light of the preliminary exposure) or may be made after or before the irradiation with the light of the preliminary exposure.

Therefore, if the drive for correcting the displacement is continued and the movement is continued in a direction of reducing the displacement amount after the preliminary exposure at time A, the gain Ki (the control gain) of the integrator is set to a higher value than before time A as indicated by a solid line. This results in a speedup and an increase in a change in a thrust force of the substrate stage 4 that counters the resisting force of the imprint material 14 having the increased viscosity due to the preliminary exposure, so that the displacement converges earlier as indicated by the solid line in FIG. 4. After the displacement converges, the imprint material 14 is irradiated with the light for curing the imprint material 14 at time B, and this method allows the imprint material 14 to be cured at an earlier time compared to B' in the case of the dotted line. Therefore, the time period required for the alignment can be reduced. In the present example, the gain of the integrator has been described as the control gain, but the control gain is not limited to the gain of the integrator and a proportional gain or a differential gain in the PID control may be changed or a plurality of gains may be controlled in combination.

As illustrated in FIG. 4, the displacement amount falls below the allowable value at both time B and time B' and the imprint material 14 is cured and the relative positions of the substrate 10 and the mold 8 are fixed after that. Therefore, after the imprint material 14 is cured, it is desirable to set a small value as the constant (the gain) of the stage control calculator 202, which controls the substrate stage 4, including the gain Ki of the integrator. Thus, by reducing the gain of the integrator after the imprint material 14 is cured, generation of an unnecessary force applied to the cured imprint material 14 in the X/Y direction is suppressed, thereby reducing breakage of the pattern.

Regarding an amount of the change in the constant of the stage control calculator 202, which controls the substrate stage 4, including the gain Ki of the integrator between before and after time A, a value thereof can be determined according to an amount of the change in the viscosity of the imprint material 14 (an increase amount). For example, an amount of a change in the constant (a gain change amount) can be determined in advance based on a value resulting from previous measuring of an illuminance in the preliminary exposure using the preliminary exposure unit 6 and/or the irradiation time period of the preliminary exposure. For example, the irradiation time period of the preliminary exposure and the irradiation time period for curing the imprint material 14 can be changed. The irradiation time period for the preliminary exposure can be set to a shorter time than the irradiation time period for curing the imprint material 14, and the alignment between the mold 8 and the substrate 10 can be carried out even after the preliminary exposure. Alternatively, the change amount can also be determined in real time according to an amount of the change in the instruction value 203 between before and after time A. The imprint apparatus 1 according to the present exemplary embodiment repeats the imprint operation for each of the shot regions disposed on the substrate 10. Therefore, determining of the amount of the change in the gain of the integrator is also possible by estimating the change amount at the time of the current imprinting from the amount of the change in the instruction value 203 at the time of the previous imprinting.

A change in a viscosity coefficient of the imprint material 14 that is caused by the preliminary exposure is assumed to reach approximately 10 to 100 times. Regarding the amount of the change in the constant between before and after the preliminary exposure, the value after the preliminary exposure depends on the type of the calculator used in the stage control calculator 202. However, in the case where the input and the output of the calculator are in a linear relationship, the value after the preliminary exposure can be increased within a range of approximately 10 to 100 times similarly to the change in the viscosity coefficient.

Further, the imprint apparatus 1 according to the present exemplary embodiment corrects the displacement between the mold 8 and the substrate 10 by driving the substrate stage 4 in the X/Y direction. However, the imprint apparatus 1 may include, in the mold holding mechanism 3, an actuator that can drive the mold holding mechanism 3 in the X/Y direction and a sensor that measures the position thereof in the X/Y direction, and correct the displacement between the mold 8 and the substrate 10 by driving the mold holding mechanism 3 in the X/Y direction. The imprint apparatus 1 can acquire a similar effect to a case where the substrate stage 4 is driven by generating an instruction value directed to the actuator that drives the mold holding mechanism 3 in the X/Y direction with use of a configuration similar to FIG. 4. Alternatively, the imprint apparatus 1 may correct the displacement between the mold 8 and the substrate 10 by driving both the substrate stage 4 and the mold holding mechanism 3.

(Method for Manufacturing Product)

The pattern of the cured object which is formed with use of the imprint apparatus 1 is permanently used for at least a part of various kinds of products or is temporarily used when the various kinds of products are manufactured. Examples of the products include an electric circuit element, an optical element, a micro electro mechanical system (MEMS), a recording element, a sensor, and a mold. Examples of the electric circuit element include a volatile or non-volatile semiconductor memory, such as a dynamic random access memory (DRAM), a static random access memory (SRAM), a flash memory, and a magnetoresistive random access memory (MRAM), and a semiconductor element, such as a large scale integration (LSI), a charge coupled device (CCD), an image sensor, and a field-programmable gate array (FPGA). Examples of the mold include a mold for imprinting.

The pattern of the cured object is directly used as a component of at least a part of the above-described products or is temporarily used as a resist mask. The resist mask is removed after etching, ion implantation, or the like is carried out during a substrate processing process.

Next, a specific method for manufacturing the product will be described. As illustrated in FIG. 6A, a substrate $1z$ such as a silicon wafer including a processing target member $2z$ such as an insulator formed on a surface thereof is prepared. Subsequently, an imprint material $3z$ is applied onto a surface of the processing target member $2z$ by the inkjet method or the like. In the present example, FIG. 6A illustrates a state in which the imprint material $3z$ is supplied onto the substrate $1z$ in the form of a plurality of droplets.

As illustrated in FIG. 6B, a mold $4z$ for the imprinting is placed so as to face the imprint material $3z$ while one side thereof on which a concave-convex pattern is formed is oriented toward the imprint material $3z$. As illustrated in FIG. 6C, the substrate $1z$ with the imprint material $3z$ applied thereon and the mold $4z$ are brought into contact with each other, and a pressure is applied thereto. The workpiece is filled with the imprint material $3z$ in a gap between the mold $4z$ and the processing target member $2z$. When irradiated with the light as the curing energy via the mold $4z$ in this state, the imprint material $3z$ is cured.

As illustrated in FIG. 6D, when the mold $4z$ and the substrate $1z$ are separated from each other after the imprint material $3z$ is cured, the pattern of the cured object of the imprint material $3z$ is formed on the substrate $1z$. This pattern of the cured object is shaped in such a manner that a concave portion of the mold $4z$ corresponds to a convex portion of the cured object, and a convex portion of the mold $4z$ corresponds to a concave portion of the cured object, which means that the concave-convex pattern of the mold $4z$ is transferred onto the imprint material $3z$.

As illustrated in FIG. 6E, when the etching is carried out with use of the pattern of the cured object as an etching-resistant mask, portions of the surface of the processing target member $2z$ where the cured object is absent or thinly remains are removed and turned into grooves $5z$. It is also desirable to remove the remaining portion in advance by a different type of etching from this etching. As illustrated in FIG. 6F, when the pattern of the cured object is removed, the product can be acquired with the grooves $5z$ formed on the surface of the processing target member $2z$. In the present example, the pattern of the cured object is removed, but may also be used as, for example, an interlayer insulation film included in a semiconductor element or the like, i.e., as the component member of the product without being removed after the processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-100075, filed May 24, 2018, which is hereby incorporated by reference herein in its entirety.

What is claimed is:

1. An imprint method for forming a pattern of an imprint material on a substrate by aligning the substrate and a mold with each other and curing the imprint material, the imprint method comprising:
    bringing the mold and the imprint material into contact with each other;
    irradiating the imprint material with light to increase a viscosity of the imprint material on the substrate while the mold and the imprint material are in contact with each other;
    aligning the substrate and the mold with each other while increasing a control gain to be used for a controller from a first value to a second value greater than the first value, the controller being configured to control relative positions of the mold and the substrate so as to reduce a displacement between the substrate and the mold, while the mold and the imprint material are in contact with each other; and
    curing the imprint material by irradiating the imprint material with light,
    wherein, before the imprint material is cured, the control gain is reduced from the second value to a third value less than the second value.

2. The imprint method according to claim 1, wherein the change is made during the irradiation with the light for increasing the viscosity of the imprint material.

3. The imprint method according to claim 1, wherein a change amount of the control gain is determined according to at least one of an illuminance time period and an irradiation time period of the light for increasing the viscosity of the imprint material.

4. The imprint method according to claim 2, wherein the control gain is changed according to a change in the viscosity of the imprint material in the irradiation.

5. The imprint method according to claim 1, wherein the irradiation includes irradiation of the imprint material contacting at least a part of a peripheral region surrounding a pattern region formed on the mold with the light for increasing the viscosity of the imprint material.

6. The imprint method according to claim 1, wherein an exposure amount of the light for increasing the viscosity of the imprint material is smaller than an exposure amount of the light for curing the imprint material.

7. The imprint method according to claim 6, wherein an irradiation time period for increasing the viscosity of the imprint material is shorter than an irradiation time period for curing the imprint material.

8. The imprint method according to claim 6, wherein intensity of the light for increasing the viscosity the imprint material is lower than intensity of the light for curing the imprint material.

9. The imprint method according to claim 1, wherein an irradiation area on the substrate over which the imprint material is irradiated with the light for increasing the viscosity of the imprint material is smaller than an irradiation area on the substrate over which the imprint material is irradiated with the light for curing the imprint material.

10. A method for manufacturing a product comprising:
    forming a pattern of an imprint material on a substrate after aligning a mold and the substrate with use of an imprint method;
    processing the substrate with the pattern formed thereon by the forming of the pattern; and manufacturing the product from the substrate processed by the processing, wherein the imprint method includes bringing the mold and the imprint material into contact with each other, irradiating the imprint material with light to increase a viscosity of the imprint material on the substrate while the mold and the imprint material are in contact with each other, aligning the substrate and the mold with each other while increasing a control gain to be used in a controller from a first value to a second value greater than the first value, the controller being configured to control relative positions of the mold and the substrate so as to reduce a displacement between the substrate and the mold, while the mold and the imprint material are in contact with each other, and curing the imprint material by irradiating the imprint material with light, wherein, before the imprint material is cured, the control gain is reduced from the second value to a third value less than the second value.

* * * * *